United States Patent
Kim

(10) Patent No.: US 12,009,209 B2
(45) Date of Patent: Jun. 11, 2024

(54) PROCESS FOR PREPARING A SUPPORT FOR A SEMICONDUCTOR STRUCTURE

(71) Applicant: Soitec, Bernin (FR)

(72) Inventor: Young-Pil Kim, Grenoble (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 17/938,427

(22) Filed: Oct. 6, 2022

(65) Prior Publication Data
US 2023/0033356 A1 Feb. 2, 2023

Related U.S. Application Data

(63) Continuation of application No. 16/618,757, filed as application No. PCT/EP2018/067262 on Jun. 27, 2018, now Pat. No. 11,508,578.

(30) Foreign Application Priority Data

Jun. 30, 2017 (FR) ........................................ 1756092

(51) Int. Cl.
*H01L 21/02* (2006.01)
*C23C 16/24* (2006.01)
(Continued)

(52) U.S. Cl.
CPC ........ *H01L 21/02658* (2013.01); *C23C 16/24* (2013.01); *C23C 16/26* (2013.01);
(Continued)

(58) Field of Classification Search
CPC ......... H01L 21/02164; H01L 21/02238; H01L 21/02529; H01L 21/02595;
(Continued)

(56) References Cited

U.S. PATENT DOCUMENTS

| 6,589,868 B2 | 7/2003 | Rossman |
|---|---|---|
| 7,479,187 B2 | 1/2009 | Otsuka |

(Continued)

FOREIGN PATENT DOCUMENTS

| JP | 2013-051350 A | 3/2013 |
|---|---|---|
| JP | 2017-059830 A | 3/2017 |

(Continued)

OTHER PUBLICATIONS

International Search Report for International Application No. PCT/EP2018/067262 dated Aug. 23, 2018, 3 pages.

(Continued)

*Primary Examiner* — Brook Kebede
(74) *Attorney, Agent, or Firm* — TraskBritt

(57) ABSTRACT

A process for preparing a support comprises the placing of a substrate on a susceptor in a chamber of a deposition system, the susceptor having an exposed surface not covered by the substrate; the flowing of a precursor containing carbon in the chamber at a deposition temperature so as to form at least one layer on an exposed face of the substrate, while at the same time depositing species of carbon and of silicon on the exposed surface of the susceptor. The process also comprises, directly after the removal of the substrate from the chamber, a first etch step consisting of the flowing of an etch gas in the chamber at a first etching temperature not higher than the deposition temperature so as to eliminate at least some of the species of carbon and silicon deposited on the susceptor.

18 Claims, 2 Drawing Sheets

(51) Int. Cl.
*C23C 16/26* (2006.01)
*C23C 16/44* (2006.01)

(52) U.S. Cl.
CPC ...... *C23C 16/4404* (2013.01); *C23C 16/4405* (2013.01); *H01L 21/02238* (2013.01)

(58) Field of Classification Search
CPC ... H01L 21/02658; C23C 16/24; C23C 16/26; C23C 16/4404; C23C 16/4405
See application file for complete search history.

(56) References Cited

U.S. PATENT DOCUMENTS

| 9,410,265 | B2 | 8/2016 | Hager et al. | |
| 11,251,265 | B2* | 2/2022 | Figuet | H01L 21/7624 |
| 2002/0173164 | A1 | 11/2002 | Raffin et al. | |
| 2003/0148223 | A1 | 8/2003 | Campana et al. | |
| 2004/0115876 | A1 | 6/2004 | Goundar et al. | |
| 2015/0115480 | A1 | 4/2015 | Peidous et al. | |
| 2015/0232986 | A1 | 8/2015 | Kameda et al. | |
| 2017/0084478 | A1* | 3/2017 | Nguyen | H01L 21/0262 |
| 2017/0087606 | A1 | 3/2017 | Nakamura et al. | |

FOREIGN PATENT DOCUMENTS

| TW | 201716647 A | 5/2017 |
| WO | 2016/103924 A1 | 6/2016 |

OTHER PUBLICATIONS

International Written Opinion for International Application No. PCT/EP2018/067262 dated Aug. 23, 2018, 6 pages.
Japanese Notice of Reasons for Rejections for Japanese Application No. 2019-563544 dated Jul. 5, 2022, 5 pages.
Singapore Written Opinion for SG Application No. 11201909910S dated Jul. 3, 2020, 4 pages.
Taiwan Office Action and Search Report for Taiwan Application No. 107122218 dated Sep. 23, 2021.
Chinese First Notification of Office Action for Application No. 201880030608.5 dated Mar. 9, 2023, 9 pages.
Korean Office Action for Application No. 10-2019-7038520 dated Dec. 7, 2022, 4 pages.
Taiwan Office Action for Taiwanese Application No. 11021262290 dated Dec. 27, 2021, 8 pages.

* cited by examiner

PROCESS FOR PREPARING A SUPPORT FOR A SEMICONDUCTOR STRUCTURE

CROSS-REFERENCE TO RELATED APPLICATIONS

This application is a continuation of U.S. patent application Ser. No. 16/618,757, filed Dec. 02, 2019, now U.S. Pat. No. 11,508,578, issued Nov. 22, 2022, which is a national phase entry under 35 U.S.C. § 371 of International Patent Application PCT/EP2018/067262, filed Jun. 27, 2018, designating the United States of America and published as International Patent Publication WO 2019/002376 A1 on Jan. 3, 2019, which claims the benefit under Article 8 of the Patent Cooperation Treaty to French Patent Application Serial No. 1756092, filed Jun. 30, 2017, the disclosure of each of which is hereby incorporated herein in its entirety by this reference.

TECHNICAL FIELD

The present disclosure relates to a process for preparing a support. The support may be used to form a semiconductor structure having improved radiofrequency characteristics.

BACKGROUND

Integrated devices are usually formed on substrates which are principally used as a support for their fabrication. However, the growth in the degree of integration and in the performance characteristics expected from these devices is leading to a closer and closer coupling between their performance characteristics and the properties of the substrate on which they are formed. This is particularly the case for radiofrequency (RF) devices, processing signals with frequencies in the range between around 3 kHz and 300 GHz, whose application is notably in the field of telecommunications (telephony, Wi-Fi, Bluetooth, etc.).

By way of example of device/substrate coupling, the electromagnetic fields, coming from the high-frequency signals propagating in integrated devices, penetrate into the depth of the substrate and interact with the potential charge carriers present within the substrate. This results in an unnecessary consumption of a part of the energy of the signal by coupling loss and potential influences between components via "crosstalk."

According to a second example of coupling, the charge carriers of the substrate may lead to the generation of undesirable harmonics, which can interfere with the signals propagating within the integrated devices and degrade their qualities.

These phenomena are notably observable when the substrate employed comprises a buried layer of insulator, between a support and a thin layer on and within which the integrated devices are formed. The charges trapped in the insulator lead to charges of complementary signs being accumulated under this layer of insulator, within the support, forming a conducting plane. In this conducting plane, the mobile charges are able to interact strongly with the electromagnetic fields generated by the components of the thin layer.

In order to pre-empt or limit this phenomenon, a known solution is to insert between the buried insulator and the support, directly under the insulator, a charge-trapping layer, for example, a layer of 1 to 5 microns of polycrystalline silicon. The grain boundaries between the grains in the polycrystalline material then form traps for the charge carriers, where the latter may come from the trapping layer itself or from the underlying support. In this way, the formation of the conducting plane under the insulator is prevented.

The device/substrate coupling then depends on the intensity of interaction of the electromagnetic fields with the mobile charges of the support. The density and/or the mobility of these charges depend on the resistivity of the support.

When the resistivity of the substrate is relatively high (and hence a relatively low charge density), higher than 1000 ohm·cm, a trapping layer of 1 to 5 microns in thickness may be suitable for limiting the device/substrate coupling. The integrity of the signals, and hence the radiofrequency performance of the devices integrated into the thin layer are thus preserved.

When, on the other hand, the resistivity of the substrate is lower, below 1000 ohm·com, or when the expected performance of the integrated device is high, it would be desirable to be able to form a very thick trapping layer, thicker than 5 microns, or even 10 or 15 microns, in order to push the region in which the charges are mobile deeper into the substrate. The interactions with the electromagnetic fields propagating very deeply could thus be prevented, and the performance of the devices integrated into the thin layer further improved.

However, it has been observed that a thickness of a trapping layer greater than 5 microns did not lead to the expected improvement in performance.

The document US 20150115480 discloses a substrate comprising a support for a semiconductor structure, the support being equipped with a trapping layer formed from a stack of polycrystalline or amorphous layers of silicon, of silicon germanium, of silicon carbide and/or of germanium. These layers are passivated. In other words, their interfaces are composed of an ultra-thin layer of insulator such as an oxide of silicon or nitride of silicon. Such a passivation is obtained, according to this document, by exposing the free surface of these layers during their fabrication to an environment rich in oxygen or in nitrogen.

According to this document, the multilayer structure of the trapping layer is claimed to prevent the phenomenon of re-crystallization of the polycrystalline trapping layer when the substrate is exposed to a very high temperature, for example, during its fabrication or the fabrication of integrated devices on this substrate. When the trapping layer re-crystallizes, even partially, the RF performance characteristics of the substrate and of the integrated devices that will be formed on it are affected, which is of course undesirable.

The support provided by this document is not, however, entirely satisfactory.

In the first place, the ultra-thin passivation layers of insulator that this document envisages to form are not generally stable at elevated temperature, notably when this insulator is silicon dioxide. Exposure of the support to a high temperature can lead to the dissolution of the oxide in the polycrystalline layers and to the disappearance of the passivation layers. The trapping layers are then likely to re-crystallize if the treatment of the support at high temperature continues.

If these insulating passivation layers are formed with a sufficient thickness to ensure their stability at elevated temperature, they then form barriers to the diffusion of the charges present into the support and into the layers of the stack. When the traps of a layer of the stack are all saturated with charge carriers, the latter remain confined within the layer and accumulate within it, and cannot be driven toward other traps available in other layers of the stack. The RF performance characteristics of the substrate are therefore accordingly degraded.

Moreover, the charges trapped in the relatively thick insulating passivation layers lead to the formation of conducting planes under their surface, reproducing the phenomena observed under a buried layer of oxide of an SOI structure which has previously been described. The polycrystalline structure of the trapping layers can only partially compensate for this quantity of additional charges. Here again, the RF performance characteristics of the substrate are accordingly degraded.

Moreover, the process of fabrication of the support disclosed by the aforementioned document must be perfectly controlled in order to avoid the generation of particles. The presence of such particles on the surface of the support may prevent its effective bonding onto a donor substrate which is needed in order to form a semiconductor structure comprising a buried insulator. Particles may also prevent the formation of functional semiconductor devices on such a semiconductor structure.

A layer formation in a deposition system, such as a chemical vapor deposition (CVD) tool, is known to be a potential source of particles, and particular attention is given to regularly cleaning the chamber of the equipment in order to avoid or to limit the generation of such particles. In certain cases, an etch gas is caused to flow in the chamber at a high temperature in order to remove the deposition that may have been formed on the wall of the chamber and the surface of the susceptor. Such processes are, for example, described in U.S. Pat. Nos. 9,410,265, 6,589,868 or 7,479,187. The term "susceptor" makes reference to any given part of a material which is provided in the deposition chamber for receiving the substrate on which the deposition will take place.

BRIEF SUMMARY

Purpose of the Present Disclosure

It has been observed that the known process consisting in avoiding the generation of particles was not effective when the support was prepared by the deposition of layers comprising silicon and carbon species.

The present disclosure aims to overcome all or part of the aforementioned drawbacks.

The subject of the present disclosure is to provide a process for preparing a support, comprising the following steps:
placing a substrate on a susceptor in a chamber of a deposition system, the susceptor having an exposed surface not covered by the substrate;
causing a precursor containing carbon and a precursor containing silicon to flow in the chamber at a deposition temperature so as to form at least one layer (2a, 2b) on an exposed face of the substrate, while at the same time forming depositions of carbon and of silicon on the exposed surface of the susceptor;
and, directly after the removal of the substrate from the chamber, applying a first etch step by causing an etch gas to flow in the chamber at a first etching temperature not higher than the deposition temperature in order to eliminate at least some of the species of carbon and of silicon deposited on the susceptor.

According to other advantageous and non-limiting features of the present disclosure, taken individually or according to any technically feasible combination:

the precursor containing carbon comprises propane, butane or a gaseous compound of silicon, carbon and hydrogen, such as methylsilane;
the precursor containing the silicon comprises the silane, disilane, trichlorosilane or dichlorosilane;
the susceptor is composed of silicon carbide or graphite;
the deposition temperature is in the range between 800° C. and 1100° C.;
the species deposited on the susceptor comprise less than 50% of carbon species, and the first etching temperature is in the range between 700° C. and 1050° C.;
where the species deposited on the susceptor comprise more than 10% of carbon species, and the first etching temperature is lower than 900° C.;
the process furthermore comprises, after the first etch step, the application of a second etch step by causing an etch gas to flow in the chamber at a second temperature higher than the deposition temperature;
the second etching temperature is in the range between 1100° C. and 1150° C.;
the first etch step is applied for a period in the range between 5 seconds and 15 minutes;
the process furthermore comprises, in the absence of a substrate in the chamber, a coating step consisting in causing a precursor containing silicon to flow in the chamber in order to form a protective layer of polysilicon on the susceptor; and/or
the etch gas comprises a chloride.

BRIEF DESCRIPTION OF THE DRAWINGS

Other features and advantages of embodiments of the present disclosure will become apparent from the detailed description of example embodiments of the present disclosure that follows with reference to the appended figures, in which.

DETAILED DESCRIPTION

Figure 1:
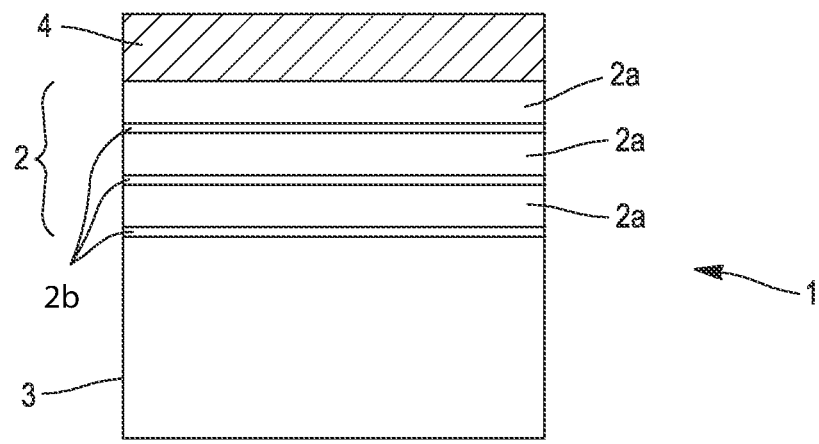
FIG. 1 shows schematically a support for a semiconductor structure according to a first embodiment.

FIG. 1 shows schematically a support for a semiconductor structure, which may be formed in a particular embodiment of the present disclosure. The support 1 may take the form of a circular wafer, with standard dimensions, for example, 200 mm or 300 mm, or even 450 mm in diameter. However, the present disclosure is not limited in any way to these dimensions or to this shape.

Thus, in the case where the semiconductor structure were a finished or semi-finished integrated device, the support 1 would take the form of a block of material of longitudinal rectangular or square cross-section whose dimensions, from a few millimeters to a few centimeters, correspond to the dimensions of the integrated device.

The support 1 comprises a base substrate 3, typically of several hundred microns in thickness. Preferably, and notably when the support 1 is intended to receive a semiconductor structure whose expected RF performance characteristics are high, the base substrate has a high resistivity, higher than 1000 ohm·centimeter, and more preferably even higher than 3000 ohm·centimeter. In this way, the density of the charges, holes or electrons, which are able to travel within the base substrate, is limited. However, the present disclosure is not limited to a base substrate exhibiting such a resistivity, and it also provides advantages in RF performance when the base substrate exhibits a more normal resistivity, on the order of a few hundreds of ohm·centimeters or less, for example, less than 1000 ohm·centimeters or less than 500 ohm·centimeters, or even less than 10 ohm·centimeters.

For reasons of availability and of cost, the base substrate is preferably made of silicon. It may, for example, be a substrate CZ with a low interstitial oxygen content which has, as is well known per se, a resistivity that may be higher than 1000 ohm·centimeters. The base substrate may alternatively be formed from another material: this may be, for example, sapphire, silicon carbide, etc.

The support 1 also comprises, directly in contact with the base substrate 3, a trapping layer 2. As has been discussed in detail in the introduction to the present disclosure, the trapping layer has the role of trapping the charge carriers that may be present in the support 1 and of limiting their mobility. This is notably the case when the support 1 is equipped with a semiconductor structure emitting an electromagnetic field penetrating into the support, and hence likely to interact with these charges.

The trapping layer 2 comprises a main polycrystalline layer 2a.

For the same reasons of availability and of cost, which have already been mentioned, the main layer 2a is preferably made of polycrystalline silicon. However, it may be composed of another semiconductor and polycrystalline material, or comprise a part (for example, a section 2a of the layer 2 in FIG. 1) made of another semiconductor and polycrystalline material. This may be, for example, germanium, silicon germanium, etc.

In any case, the main layer 2a has a high resistivity greater than 3000 ohm·centimeters. For this purpose, the main layer 2a is not intentionally doped, in other words it has a concentration of dopants less than 10 E14 atoms per cubic centimeter. It may be rich in nitrogen or in carbon in order to enhance its resistivity.

The trapping layer 2 also comprises, interposed within the main layer 2a or between the main layer 2a and the base substrate 3, at least one polycrystalline interlayer composed of an alloy of silicon and carbon or of carbon, exhibiting a resistivity higher than 1000 ohm·centimeters. These are materials that are very stable in temperature, in other words, even when exposed to very high temperatures exceeding those that are generally used for the fabrication of semiconductor structures (500° to 1300°), these materials preserve their micro- and macroscopic structures. As will be described in more detail herein below, the alloy of silicon and carbon or the carbon forming the intermediate layer may be formed by depositing silicon and carbon or by surface carbonization. Its nature is generally polycrystalline, but when it is formed by carbonization of a crystalline substrate, it may have a crystalline or partially crystalline nature.

The trapping layer 2 is thus composed of the main layer 2a and of at least one intermediate layer 2b. In this particular embodiment, the idea is not to incorporate other layers, in particular, electrically-insulating layers, which could modify the advantageous properties of the trapping layer provided.

By interposing at least one such interlayer 2b within the main polycrystalline layer 2a, a stack is formed that is stable at elevated temperature, which prevents the re-crystallization of the main polycrystalline layer 2a during thermal treatment steps that the support 1 may undergo.

The use of an insulating material can generate different drawbacks. In addition, their properties of resistivity and of polycrystallinity contribute to the trapping of the charges within the trapping layer 2, similarly to what takes place in the main layer 2a.

When the support 1 comprises several interlayers 2b, the latter may be of the same nature or of a different nature, this nature still being chosen from within the list of the aforementioned materials.

The trapping layer 2 composed, on a base substrate 3, of the main layer 2a and of at least one interlayer 2b, therefore forms a support for a semiconductor structure that is stable at elevated temperature, in other words not easily re-crystallized, and efficient for trapping the charge carriers. It has indeed a very high density of traps accessible to the charges.

Moreover, by interposing in this way at least one layer 2b within the main layer 2a, it has been observed, surprisingly, that it was possible to form a trapping layer 2 of thickness greater than 2 microns, allowing the RF performance characteristics of the support to be improved.

Complementary studies have shown that the grains that form the main polycrystalline layer 2a preferably have a size in the range between 100 nm (below which their thermal stability is no longer ensured and where there is a risk of their re-crystallization in temperature) and 1000 nm (beyond which the RF performance of the support is affected).

It turns out that the interlayer (or interlayers) 2b composed of an alloy of silicon and carbon exhibits a significant difference in lattice parameters with the polycrystalline silicon of the main layer (the lattice parameter of the interlayer being smaller than that of the main layer). In this way, a very high density of crystalline defects is generated, and the epitaxial relationship between the layers of polysilicon and the interlayer is lost as they grow. The particular polycrystalline arrangement of the main layer 2a under an interlayer 2b is lost and is not reproduced within the portion of the main layer 2a above the interlayer.

These observations allow advantageous characteristics of the trapping layer 2 to be established according to the present disclosure.

Thus, the trapping layer may advantageously comprise between 1 and 10 interlayers. In this way, and without forming an excessively complex and costly stack, the size of the grains of the trapping layer 2a may be controlled, even for significant thicknesses of the trapping layer 2, greater than 5 microns, and even greater than 10 microns.

Preferably, each interlayer 2b formed from an alloy of silicon and carbon or formed from carbon, has a lattice parameter less than the lattice parameter of the material (or materials) forming the main layer 2a.

Advantageously, the thickness of the portion of main layer 2a included between two successive interposed layers 2b may be in the range between 0.2 and 2.5 microns. The grains are thus prevented from becoming too large in the upper part of this portion.

The trapping layer 2 may have a thickness greater than 2 microns, or even greater than 10 microns. Whether its thickness is greater than or less than these limits, the main layer 2a may be composed of grains whose size is in the range between 100 and 1000 nanometers. A support 1 exhibiting greatly improved RF performance characteristics with respect to what it is possible to obtain with the supports according to the prior art is then obtained.

An alloy of silicon and carbon, or carbon, forming the interlayer(s) 2b, may exhibit a thermal expansion coefficient very different from that forming the main layer 2a. It is in this case preferable to limit their thickness, for example, to less than 10 nm, or even less than 5 nm. In this way, creating stresses in the support 1 is avoided when the support 1 is subjected to a high temperature.

The alloy of silicon and carbon may correspond to silicon carbide, or to carbon-doped silicon. Preferably, the carbon-doped silicon has more than 5% of carbon.

Finally, and as is shown in FIG. 1, the support may have a layer of insulator 4 directly on the trapping layer 2. This layer of insulator 4, which is optional, can facilitate the assembly of the support 1 with a semiconductor structure.

Figure 3:
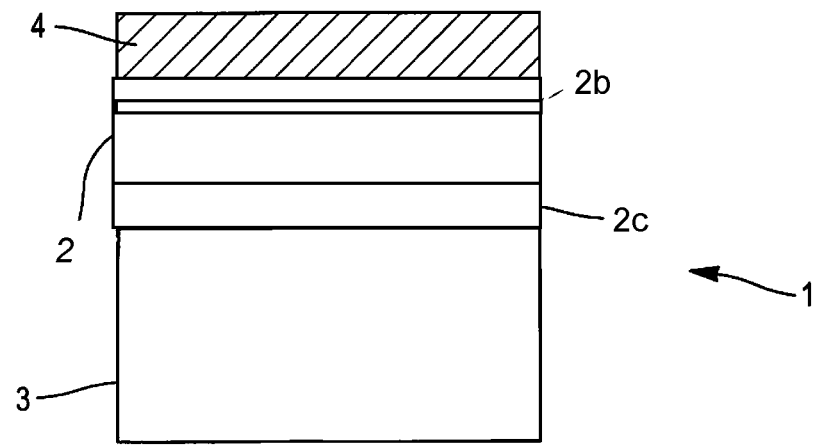
FIG. 3 shows schematically a support for a semiconductor structure according to another embodiment.

FIG. 3 shows schematically a support 1, which may be formed according to another embodiment of the present description.

It comprises a base substrate 3, similar to that already described in relation with the base substrate of the first embodiment. For the sake of brevity, its characteristics are not repeated here.

The support 1 also comprises, on and in direct contact with the base substrate 3, a first insulating layer 2c of silicon dioxide. The first insulating layer 2c has a thickness greater than 20 nm, for example, in the range between 20 nm and 20 microns. The first insulating layer 2c may be obtained by oxidation of the base substrate 3 or by deposition onto this base substrate 3. For cost reasons, its thickness may be in the range between 100 nm and 200 nm, for example, 145 nm. Beyond 20 nm, the first insulating layer 2c is stable, even when it is exposed to intense thermal treatment steps. It may accordingly be exposed to a temperature equal to or higher than 1200° C. for many hours without being damaged or degraded, for example, by dissolution.

The support 1 also comprises, on and in direct contact with the first insulating layer, a trapping layer 2. The trapping layer 2 has a resistivity higher than 1000 ohm·cm, preferably higher than 10 kohm·cm.

The trapping layer 2 may generally consist of a non-single-crystalline semiconductor layer having structural defects such as dislocations, grain boundaries, amorphous regions, interstices, inclusions, pores, etc. These structural defects form traps for the charges, which can flow within the material, for example, via chemical bonds, which are not complete or in progress. Conduction is thus prevented in the trapping layer, which consequently has a high resistivity. Since the trapping layer 2 is not in direct contact with the support but with the first amorphous insulating layer 2c, the trapping properties of this layer can be preserved even when the support is subjected to a very significant thermal treatment. The structural defects do not undergo a re-crystallization.

For the same reasons of availability and of cost that have already been mentioned, the trapping layer 2 is preferably made of polycrystalline silicon. However, it may be composed of or may comprise another polycrystalline and semiconductor material. As a variant, the trapping layer 2 may be composed of or may comprise amorphous or porous silicon.

As shown in FIG. 3, the trapping layer 2 also comprises at least one interlayer 2b interposed within the trapping layer 2, for example, a layer of carbon or a layer composed of an alloy of silicon-carbon. The interlayer may also furthermore comprise interlayers 2b, for example, of silicon oxide or silicon nitride. In this case, the trapping layer 2 is subsequently formed by an alternation of layers of polycrystalline silicon (or of another material, or of an amorphous or porous material) and of interlayers of various natures (of silicon dioxide or nitride, of carbon, etc.).

In any case, the trapping layer 2 has a high resistivity, higher than 1000 ohm·centimeters. For this purpose, the trapping layer is not intentionally doped, in other words it has a concentration of dopant carrying charges of less than $10 \text{ E}14$ atoms per cubic centimeter. It may be rich in nitrogen or carbon in order to enhance its resistivity characteristics.

Figure 4:
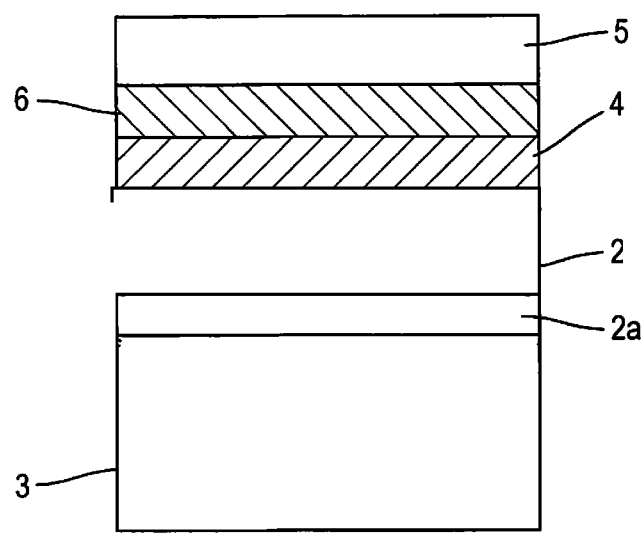
FIG. 4 shows a substrate of the semiconductor-on-insulator type comprising a support according to the other embodiment.

Finally, and as shown in FIG. 4, the support may also be equipped with a surface layer of insulator 4, directly on the trapping layer 2, exactly as in the first embodiment.

The fabrication of a support 1 according to the various embodiments provided is particularly simple and achievable with a standard deposition tool of the industry.

The base substrate 3 is provided and placed in a usual deposition system. The base substrate 3 may comprise a layer of native oxide so as to form a support 1 as described in the first embodiment. After the base substrate 3 has been placed on the susceptor in the deposition chamber, it may be prepared prior to its deposition, for example, in order to eliminate a layer of native oxide from its surface. This step is not obligatory and this oxide may be preserved. It is indeed sufficiently thin, from 1 to 2 nm, not to have an insulating effect (conduction through this layer by tunnel effect) even if the thermal treatment steps to come will not have made it completely disappear by dissolution.

As a variant, the base substrate may comprise a first insulating layer 2c in order to form a support as described in the second embodiment, and be placed on the susceptor in the chamber of the deposition equipment.

A precursor containing silicon, for example, $SiH_4$, is caused to flow through the chamber at a temperature of the order of 1000° C., in order to form the main layer 2a, in the present case of polycrystalline silicon. A precursor containing silicon may also comprise a gas mixture of silanes, such as silane and disilane, or chlorosilanes, such as trichlorosilane and dichlorosilane.

At given moments in time during this deposition process, a precursor gas is introduced into the chamber for a given duration with a view to forming the interlayer or interlayers 2b comprising carbon. The precursor gas may comprise or be composed of, for example, methane ($CH_4$), ethane ($C_2H_6$), propane ($C_3H_8$), acetylene ($C_2H_2$), ethylene ($C_2H_4$), butane or of a gaseous compound of silicon, carbon and hydrogen, such as methylsilane, etc.

The flow of the precursor containing silicon may be interrupted during this interval of time so as to form an interlayer 2b rich in, or consisting of, carbon.

Alternatively, the flow of the precursor containing silicon may be maintained during this interval of time, so as to form an interlayer 2b consisting of an alloy of silicon and carbon. The proportion of carbon and of silicon in this alloy may be controlled by adjusting the flow of the respective precursors.

This sequence may be repeated in order to form the trapping layer 2 targeted, the duration of flows of the various gases determining the thickness separating the successive layers 2a, 2b.

When it is desired, according to the teaching of the first embodiment, to deposit an interlayer 2b of carbon under the main layer 2a and in contact with the base substrate 3, it may be preferable to eliminate the layer of native oxide, which can cover this substrate. It is thus possible to expose the base substrate directly to the precursor gas containing carbon (e.g., $C_3H_8$), in the absence of the precursor gas containing silicon, at a temperature of approximately 1000° C. in order to form the carbon interlayer 2b. Its nature may be crystalline or partially crystalline if the base substrate 3 itself has a crystalline nature.

In order to form a section 2*a* of the main layer rich in carbon, it is also possible to form this layer section from polycrystalline silicon, and to anneal this layer in an atmosphere rich in carbon, such as $CH_3H_8$. This anneal step may be carried out in situ in the deposition equipment by introducing an atmosphere rich in carbon into the chamber, which operation is followed by the deposition of the section 2*a* of the main layer.

Irrespective of the sequence of deposition steps chosen, the process of preparation of a support 1 according to the present description comprises the flowing of carbon-containing precursors and of silicon-containing precursors in the deposition chamber, and on the base substrate 3, at a deposition temperature. This temperature may be in the range between 800° C. and 1100° C.

This leads to the formation of at least one layer on the exposed surface of the base substrate 3. This also leads to a deposition of carbon and of silicon species on the exposed surface of the susceptor, in other words the portion of the susceptor that is not covered by the base substrate 3.

After the desired formation of the trapping layer 2 on the base substrate 3, the base substrate is removed from the chamber. The chamber is subsequently prepared for the deposition of another trapping layer on another base substrate.

This preparation may comprise the flowing of an etch gas in the chamber at a high temperature, higher than the deposition temperature. However, the inventors of the present disclosure have observed that this step was particularly inefficient for eliminating depositions of carbon and of silicon on the susceptor. After having led a detailed investigation, they have observed that the etch processing, at a high temperature, caused the precipitation of the depositions of silicon and of carbon into a compound of carbon and silicon. This compound may take the form of flakes, being removed by peeling from the susceptor, constituting a source of particles, able to contaminate the substrate surface during the additional deposition step.

Additional investigations have furthermore shown that this precipitation was probably caused by the high temperature reached during the usual etch step at high temperature. It has been observed that the exact temperature of precipitation was dependent on the proportion of carbon in the species deposited on the susceptor, the higher the proportion, the lower the temperature of precipitation.

In order to avoid a precipitation, the idea of the inventors of the present disclosure is to apply, directly after the removal of the substrate from the deposition chamber (in other words prior to any thermal treatment, which may cause a precipitation), a first etch step consisting in causing an etch gas to flow in the chamber at a first etching temperature not higher than the deposition temperature. It has been demonstrated that such steps were effective for eliminating at least some of the depositions of carbon and of silicon on the susceptor.

By reducing the etching temperature so that it is lower than or equal to the deposition temperature, a complete precipitation of carbon and of silicon is prevented, and the etch gas can eliminate the non-precipitated depositions, in particular, when the concentration of carbon species in the depositions is less than 50%.

For example, when the deposition temperature is in the range between 800° C. and 1100° C., the first etching temperature may be in the range between 700° C. and 1050° C.

A typical duration of the first etch step is in the range between 5 seconds and 15 minutes. The etch gas may comprise an etching agent, such as HCl or any species containing a chloride, in combination with a noble gas or a reducing gas, such as hydrogen. The ratio of the two gases may be adjusted in order to optimize the etching efficiency. The gas flow in the chamber may be applied at a flow rate in the range between 5 and 150 slm.

In the case where the depositions onto the susceptor comprise more than 10% of carbon species, it is preferable to reduce the etching temperature to less than 900° C. Applying a first etch step within a lower range of temperatures, for example, less than 950° C., may reduce the efficiency of removal. This can be compensated by the increase in the duration of this etch step, or by the increase in the flow of the etch gas, or by the increase in the proportion of etching agents in the etch gas, by comparison with efficient conditions used at an etching temperature of 1,000° C.

After the first etch step, the chamber may be prepared by applying additional steps. The additional steps may comprise a second etch step at a second etching temperature. The second etching temperature may be higher than the deposition temperature. The second etch step may be useful for removing species other than silicon and carbon, even if a remaining trace of such species may be removed during this step.

The following steps may also comprise, in addition to or as a replacement for the second etch step, a step for coating the susceptor with a protective layer. The coating step may be carried out, in the absence of a substrate, by causing a precursor gas to flow in the chamber under temperature conditions defined for forming a protective layer on the susceptor. The precursor may be a precursor containing silicon so as to form a protective layer of polysilicon.

After the deposition, the chamber was prepared according to the teaching in the present disclosure; another base substrate 3 may be placed in the chamber for the formation of another trapping layer 2 in order to provide another support 1. It is not necessary to apply the first etch step after the preparation of each support 1. This step may be applied for every 2 or 10 depositions of trapping layers 2, for example.

A support 1 according to the present disclosure is available at the end of this deposition phase. It may undergo an optional polishing step on the trapping layer 2 in order to provide a smooth surface facilitating its assembly with a semiconductor structure.

The support may have an insulating layer 4, for example, an oxide of silicon or nitride of silicon, deposited in a usual manner. This insulator 4 may then be polished.

As already mentioned, the aim of the support 1 is to receive a semiconductor structure on the same side as the trapping layer 2.

This structure may be formed in many ways on the support 1, but advantageously this formation comprises a step for transferring a thin layer 5 onto the support.

As is well known per se, this transfer is usually carried out by assembling the face of a donor substrate to the support 1. The latter may have the layer of insulator 4 or otherwise. In the same way, the donor substrate may have had a prior coating of an insulating layer 6 of the same nature as or of a nature different from the layer of insulator 4. This may be, for example, silicon oxide or silicon nitride.

After this assembly step, the donor substrate is reduced in thickness so as to form the thin layer 5. This reduction step may be carried out by mechanical or chemical thinning. It may also be a fracture within a fragile region previously introduced into the donor substrate, for example, according to the principles of the Smart Cut™ technology.

Steps for finishing the useful thin layer 5, such as a polishing step, a thermal treatment under a reducing or neutral atmosphere, a sacrificial oxidation may be appended to the thickness reduction step.

Figure 2:
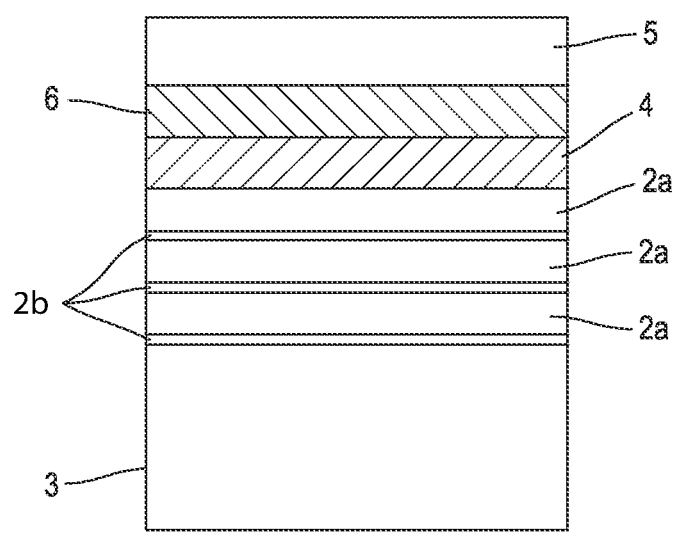
FIG. 2 shows a substrate of the semiconductor-on-insulator type comprising a support according to the first embodiment.

When the donor substrate is simply a substrate, in other words when it does not comprise any integrated device, a semiconductor structure of the semiconductor-on-insulator type, in which the thin layer 5 is a virgin layer of semiconductor, comprises the support as is shown in FIG. 2 or 4. The substrate may then be used for the formation of integrated devices.

When the donor substrate has previously been processed in order to form integrated devices on its surface, this process results in a thin layer 5 that comprises these devices.

The term "semiconductor structure" denotes any given integrated device whether the latter is formed from semiconductor materials or not. For example, it may be a device of the surface or bulk acoustic wave type, typically formed on and in a layer made of a piezo-electric material, such as lithium tantalate.

The term "semiconductor structure" also refers to a layer of virgin device material, consisting of semiconductor material or otherwise, and in which integrated devices may be formed.

Although this process has been presented in relation with the formation of a support for a semiconductor structure having improved RF characteristics, the process may be useful in any situation where depositions of silicon and of carbon are formed on the susceptor of a deposition chamber. It may also be useful for depositions of a nature other than silicon and carbon, which may precipitate into compounds that resist an etching process when they are exposed to a high temperature.

What is claimed is:

1. A charge trapping layer for a semiconductor structure support, comprising:
    at least one polycrystalline charge trapping material; and
    at least one polycrystalline interlayer directly adjacent to the charge trapping material, the at least one polycrystalline interlayer comprising an alloy of silicon and carbon,
    wherein a lattice parameter of the at least one polycrystalline charge trapping material is greater than a lattice parameter of the at least one polycrystalline interlayer.

2. The charge trapping layer of claim 1, wherein a grain size of the at least one polycrystalline charge trapping material is between 100 nanometers (nm) and 1000 nm.

3. The charge trapping layer of claim 1, wherein the at least one polycrystalline interlayer comprises silicon carbide or carbon-doped silicon.

4. The charge trapping layer of claim 1, wherein the at least one polycrystalline charge trapping material is rich in carbon or nitrogen.

5. The charge trapping layer of claim 1, comprising an alternating stack of the at least one polycrystalline charge trapping material and the at least one polycrystalline interlayer.

6. The charge trapping layer of claim 5, wherein the alternating stack comprises between one and ten polycrystalline interlayers.

7. A support for a semiconductor structure, comprising:
    a base substrate; and
    a charge trapping layer on the base substrate, the charge trapping layer comprising an alternating stack of at least one polycrystalline charge trapping material and at least one polycrystalline interlayer,
    wherein the at least one polycrystalline interlayer comprises an alloy of silicon and carbon and at least one of silicon oxide and silicon nitride.

8. The support for a semiconductor structure of claim 7, wherein the charge trapping layer has a thickness greater than 2 microns.

9. The support for a semiconductor structure of claim 7, wherein a thickness of the at least one polycrystalline interlayer is less than 10 nm.

10. The support for a semiconductor structure of claim 7, wherein a thickness of the at least one polycrystalline charge trapping material is between 0.2 microns ($\mu m$) and 2.5 $\mu m$.

11. The support for a semiconductor structure of claim 7, further comprising a silicon dioxide insulating layer directly on the base substrate, the silicon dioxide insulating layer disposed between the base substrate and the charge trapping layer.

12. The support for a semiconductor structure of claim 11, wherein the silicon dioxide insulating layer has a thickness greater than 20 nm.

13. The support for a semiconductor structure of claim 7, wherein the charge trapping layer has a resistivity greater than 1000 ohmcentimeters (ohm·cm).

14. A semiconductor structure, comprising:
    a charge trapping layer on a base substrate, the charge trapping layer comprising an alternating stack of at least one polycrystalline charge trapping material and at least one polycrystalline interlayer, wherein the at least one polycrystalline interlayer comprises an alloy of silicon and carbon;
    a silicon dioxide insulating layer on the base substrate, the silicon dioxide insulating layer disposed between the base substrate and the charge trapping layer; and
    a useful layer over the charge trapping layer.

15. The semiconductor structure of claim 14, further comprising an insulating layer on the charge trapping layer, the insulating layer disposed between the charge trapping layer and the useful layer.

16. The semiconductor structure of claim 14, wherein the semiconductor structure comprises a surface acoustic wave device or a bulk acoustic wave device.

17. The semiconductor structure of claim 14, wherein the useful layer comprises a piezoelectric material.

18. The semiconductor structure of claim 17, wherein the piezoelectric material comprises lithium tantalate.

\* \* \* \* \*

UNITED STATES PATENT AND TRADEMARK OFFICE
CERTIFICATE OF CORRECTION

PATENT NO. : 12,009,209 B2
APPLICATION NO. : 17/938427
DATED : June 11, 2024
INVENTOR(S) : Young-Pil Kim It is certified that error appears in the above-identified patent and that said Letters Patent is hereby corrected as shown below:

In the Claims

Claim 13, Column 12, Line 34, change "1000 ohmcentimeters (ohm·cm)." to --1000 ohm·centimeters (ohm·cm).--

Signed and Sealed this
Thirteenth Day of August, 2024

Katherine Kelly Vidal
*Director of the United States Patent and Trademark Office*